United States Patent [19]

Loboda

[11] Patent Number: 5,465,680
[45] Date of Patent: Nov. 14, 1995

[54] METHOD OF FORMING CRYSTALLINE SILICON CARBIDE COATINGS

[75] Inventor: Mark J. Loboda, Midland, Mich.

[73] Assignee: Dow Corning Corporation, Midland, Mich.

[21] Appl. No.: 84,914

[22] Filed: Jul. 1, 1993

[51] Int. Cl.$^6$ .................................................. C30B 25/02
[52] U.S. Cl. ................................ 117/84; 117/88; 117/89; 117/90; 117/935
[58] Field of Search .................................. 156/610, 612, 156/613, 614, DIG. 64; 437/100, 38, 39; 427/38, 39; 117/84, 88, 89, 90, 935

[56] References Cited

U.S. PATENT DOCUMENTS

| | | | |
|---|---|---|---|
| 3,843,399 | 10/1974 | Kaplan et al. | 369/273 |
| 3,960,619 | 6/1976 | Seiter | 437/100 |
| 4,532,150 | 7/1985 | Endo et al. | 427/39 |
| 4,983,538 | 1/1991 | Gatou | 437/100 |
| 5,008,127 | 4/1991 | Ogawa | 427/36 |
| 5,011,706 | 4/1991 | Tarhay et al. | 427/39 |
| 5,053,255 | 10/1991 | Boeglin | 427/249 |
| 5,232,749 | 8/1993 | Gilton | 427/558 |

FOREIGN PATENT DOCUMENTS 52-14600  6/1977  Japan.

OTHER PUBLICATIONS

Nishino et al., Appl. Phys. Lett 42(5), 1983/Mar. 1.
Addamiano et al., Appl. Phys. Lett. 44(5), 1984/Mar. 1.
Patent Abstracts of Japan, vol. 12, No. 92, 1988/Mar. 25.
Patent Abstracts of Japan, vol. 16, No. 86, 1992/Mar. 3.
Learn et al., Appl. Phys. Let., vol. 17, No. 1, Jul. 1970.
Steckl and Li, IEEE Transactions on Electron Devices, vol. 39, No. 1, Jan. 1992.
Takahashi et al., J. Electrochem. Soc., vol. 139, No. 12, Dec. 1992.
Golecki et al., Appl. Phys. Lett, 60 (14), Apr. 1992.
Noll, "Chemistry & Technology of Silicones", N.Y., Academic Press 1968, p. 87 ff.

Primary Examiner—R. Bruce Breneman
Assistant Examiner—Felisa Garrett
Attorney, Agent, or Firm—Roger E. Gobrogge

[57] ABSTRACT

A method of forming crystalline silicon carbide films is disclosed. The method comprises a chemical vapor deposition process in which a substrate is heated to a temperature above about 600° C. in the presence of trimethylsilane gas.

16 Claims, No Drawings

METHOD OF FORMING CRYSTALLINE SILICON CARBIDE COATINGS

BACKGROUND OF THE INVENTION

The present invention relates to the growth of crystalline silicon carbide films at low temperatures using trimethylsilane as the source gas in a chemical vapor deposition (CVD) process.

Crystalline silicon carbide is useful in many high temperature, high power and high frequency semiconductor device applications because of properties such as a wide bandgap, high saturated electron drift velocity, high breakdown electric field, high thermal conductivity, and good chemical resistance. However, most all device fabrication processes require the formation of single crystal silicon carbide films. Normally, these films are grown by chemical vapor deposition at temperatures above 1000° C. For instance, Learn et al., Appl. Phys. Let., Vol. 17, No. 1, July 1970, teach the formation of cubic silicon carbide on alpha (6H) and beta (3C) silicon carbide substrates by the reactive evaporation or reactive sputtering of silicon in acetylene at temperatures as low as 1100° C. Similarly, Steckl and Li, IEEE Transactions on Electronic Devices, Vol. 39, No. 1, January 1992, teach the formation of beta (3C) silicon carbide films on carbonized silicon (100) by rapid thermal chemical vapor deposition of silane and propane at 1100°–1300° C.

Other investigators have also demonstrated the deposition of 3C silicon carbide films from organosilicon precursors. For instance, Takahashi et al., J. Electrochem. Soc., Vol 139, No. 12, December 1992, teach the formation of 3C silicon carbide on Si(100) and Si(111) substrates (with and without a carbonized layer) by atmospheric pressure chemical vapor deposition using hexamethyldisilane and hydrogen gas mixtures at temperatures of 1100° C.

Golecki et al., Appl. Phys. Lett, 60 (14), April 1992, teach the formation of cubic silicon carbide on silicon (100) substrates by low pressure chemical vapor deposition using methylsilane at substrate temperatures as low as 750° C. The process described therein, however, is solely limited to the use of methylsilane as the precursor gas.

The use of trimethylsilane to form amorphous or polycrystalline silicon carbide films is also known in the art. For instance, Kaplan et al. in U.S. Pat. No. 3,843,399 teach the formation of silicon carbide coatings on video disks using trimethylsilane in a glow discharge chemical vapor deposition process. Similarly, Japanese Kokai Patent Application No. Sho 52-14600 teaches the formation of silicon carbide films on a variety of substrates using an alkylsilane in a glow discharge chemical vapor deposition process. Likewise, Edno et al. in U.S. Pat. No. 4,532,150 teaches the formation of silicon carbide coatings using an organosilicon compound in a plasma enhanced chemical vapor deposition process. Neither of these references, however, teach the formation of crystalline silicon carbide.

The present invention for the first time describes the deposition of crystalline silicon carbide films using trimethylsilane in a chemical vapor deposition process.

SUMMARY OF THE INVENTION

The present invention relates to a method of forming a crystalline silicon carbide film on a substrate. The method comprises heating the substrate to a temperature above 600° C. and exposing the heated substrate to trimethylsilane gas to thereby deposit the crystalline silicon carbide film. Optionally, a thin silicon carbide layer can be grown on the substrate by reacting it with a hydrocarbon gas ('carbonization') prior to deposition of the crystalline silicon carbide film.

DETAILED DESCRIPTION OF THE INVENTION

The present invention describes the deposition of crystalline silicon carbide (SIC) films at temperatures as low as about 600° and up to and above 1000° C. using trimethylsilane gas.

Nearly any desired substrate can be used in the process of the present invention. Generally, however, it is preferred to use a substrate comprising either single crystal silicon carbide or a single crystal silicon wafer. Such substrates are commercially available. The first step in the process of the invention is, generally, cleaning the desired substrate. This cleaning provides a pristine crystalline surface to insure epitaxial growth. Obviously, however, if such a surface is available the additional cleaning is not necessary. Nearly any method which provides the desired clean surface can be Used and many of these methods are known in the art. For instance, the substrate can be etched by dipping in an acid such as HF. Alternatively, the substrate can be etched in a corrosive atmosphere such as HCl/H2 at elevated temperatures (eg., >1000° C.).

If a silicon substrate is used, a thin buffer layer of silicon carbide can be grown on the cleaned surface. Again, processes for growing these layers are known in the art and nearly any which provides the desired silicon carbide layer can be used. One example of such a process involves exposing the silicon to a hydrocarbon gas ("carbonization") at elevated temperatures (eg., >1000° C.) under atmospheric or low pressure conditions. Hydrocarbons such as methane, ethane, propane, butane, ethylene, acetylene and the like may all be used. Specific examples of such processes include directing a stream of gas comprising propane diluted in $H_2$ (at a flow rate of 9 sccm) and $H_2$ (at a flow rate of 0.9 lpm) at the substrate under atmospheric pressure at 1300° C. to produce a 25 nanometer SiC layer in 1 minute. Another example of such a process includes directing a stream of gas comprising propane (at a flow rate of 99 sccm) and $H_2$ (at a flow rate of 0.9 lpm) at the substrate under 5 Torr at 1300° C. to produce a 120 nanometer SiC layer in 1 minute. If a silicon carbide substrate is used, it is not necessary to form the above layer.

The crystalline silicon carbide layers are then formed on the substrates by a standard chemical vapor deposition process in which the substrate is heated to the desired temperature in a deposition chamber followed by exposing the substrate to trimethylsilane. Substrate temperatures above about 600° C. are useful herein with temperatures in the range of about 600° to about 1200° C. being preferred. More preferred are temperatures in the range of about 600° to about 1000° C.

The time necessary for the formation of the films varies depending on the concentration of trimethylsilane in the growth chamber and the desired film thickness. Generally, exposure times of 1–30 minutes are sufficient.

The silicon carbide precursor used in the process of the present invention is trimethylsilane, $(CH_3)_3SiH$. This gas and methods for its production are known in the art. For example, trimethylsilane can be produced by introducing methyl groups into trichlorosilane by the Grignard process.

Alternatively, the trimethylsilane can be produced by reacting trimethylchlorosilane with a metal hydride. These and other method are described, for example, by Noll in "Chemistry and Technology of Silicones", New York, Academic Press 1968, p. 87 ff.

The trimethylsilane gas is generally diluted in the deposition chamber with an inert carrier gas. Such carriers can include, for example, hydrogen, argon and helium. Although the dilution is dependent on the rate of exposure to the substrate, generally dilutions of trimethylsilane:carrier in the range of 1:1 to 1:10000 are used.

The total pressure of the gases (trimethylsilane+carrier) in the deposition chamber can be varied over a wide range and is generally controlled to a level which provides a reasonable rate of epitaxial film growth. Generally, pressures in the range of about $10^{-6}$ torr to about atmospheric pressure are used.

The amount of chemical vapor introduced into the deposition chamber should be that which allows for a desirable SiC film growth rate. It is preferred, however, that the deposition chamber be "starved" such that nearly all of the trimethylsilane in the atmosphere is deposited, thereby slowly growing the crystalline structure. Growth rates in the range of about 1–1000 nanometers/min may generally be achieved.

The process of the invention can be conducted under static conditions, but it is usually preferred to continuously introduce a controlled amount of vapor into one portion of a chamber while drawing a vacuum from another site in the chamber so as to cause flow of the vapor to be uniform over the area of the substrate.

The deposition chamber used in the process of the invention can be any which facilitates the growth of films by a chemical vapor deposition process. Examples of such chambers are described by Golecki et al. and Steckl et al., supra.

In addition, it is contemplated that the crystalline silicon carbide epitaxial growth can be assisted by a variety of vapor deposition processes. For instance, it is contemplated that techniques such as molecular beam epitaxy, laser assisted CVD, ion beams and hot filaments can be used to decompose the gaseous species and, thereby, grow the epitaxial layer at lower temperatures.

The resultant films are single phase or polycrystalline SiC. They can be grown in a wide variety of thicknesses such as from about 0.01 microns up to and exceeding 5 microns.

That which is claimed is:

1. A method of growing an epitaxial silicon carbide film on a silicon substrate comprising:
   forming a silicon carbide buffer layer on the silicon substrate;
   heating the silicon substrate having the silicon carbide buffer layer to a temperature in the range of about 650° to 1000° C.; and
   contacting the heated silicon substrate having the silicon carbide buffer layer with a gas comprising trimethylsilane for a time sufficient to grow the epitaxial silicon carbide film.

2. The method of claim 1 wherein the silicon carbide buffer layer is formed on the silicon substrate by carbonization.

3. The method of claim 2 wherein the carbonization is performed by contacting the silicon substrate with a gas mixture comprising a hydrocarbon and hydrogen gas at a temperature above about 1000° C.

4. The method of claim 3 wherein the hydrocarbon gas is selected from the group consisting of methane, ethane, propane, butane, ethylene and acetylene.

5. The method of claim 1 wherein the silicon substrate is cleaned prior to growing the silicon carbide buffer layer by a method selected from the group consisting of dipping the substrate in an acid and exposing the substrate to $HCl/H_2$ at a temperature above about 1000° C.

6. The method of claim 1 wherein the gas also comprises an inert carrier gas in a ratio of trimethylsilane:carrier in the range of about 1:1 to about 1:10000.

7. The method of claim 1 wherein the heated silicon substrate having the silicon carbide buffer layer is contacted with the trimethylsilane gas for a time in the range of between about 1 and about 30 minutes.

8. The method of claim 1 wherein the heated silicon substrate having the silicon carbide buffer layer is contacted with the trimethylsilane gas at a pressure in the range of between about $10^{-6}$ Torr and atmospheric pressure.

9. The method of claim 1 wherein growth of the epitaxial silicon carbide film is assisted by a vapor deposition technique selected from the group consisting of molecular beam epitaxy, ion beams, lasers assisted CVD and hot filaments.

10. The method of claim 1 wherein the gas also comprises $(CH_3)_3SiP$.

11. A method of growing an epitaxial silicon carbide film on a silicon carbide substrate comprising:
    heating the silicon carbide substrate to a temperature in the range of about about 650° to 1000° C.; and
    contacting the heated silicon carbide substrate with a gas comprising trimethylsilane for a time sufficient to grow the epitaxial silicon carbide film.

12. The method of claim 11 wherein the silicon carbide substrate is cleaned prior to growing the silicon carbide film by a method selected from the group consisting of dipping the substrate in an acid and exposing the substrate to $HCl/H_2$ at a temperature above about 1000° C.

13. The method of claim 11 wherein the gas also comprises an inert carrier gas in a ratio of trimethylsilane:carrier in the range of about 1:1 to about 1:10000.

14. The method of claim 11 wherein the heated silicon carbide substrate is contacted with the trimethylsilane gas for a time in the range of between about 1 and about 30 minutes.

15. The method of claim 11 wherein the heated silicon carbide substrate is contacted with the trimethylsilane gas at a pressure in the range of between about $10^{-6}$ Torr and atmospheric pressure.

16. The method of claim 11 wherein growth of the epitaxial silicon carbide film is assisted by a vapor deposition technique selected from the group consisting of molecular beam epitaxy, ion beams, lasers assisted CVD and hot filaments.

* * * * *